United States Patent
Nagasaka

(10) Patent No.: US 11,156,966 B2
(45) Date of Patent: Oct. 26, 2021

(54) QUANTUM INTERFERENCE DEVICE

(71) Applicant: Seiko Epson Corporation, Tokyo (JP)

(72) Inventor: Kimio Nagasaka, Hokuto (JP)

(73) Assignee: Seiko Epson Corporation

(*) Notice: Subject to any disclaimer, the term of this patent is extended or adjusted under 35 U.S.C. 154(b) by 0 days.

(21) Appl. No.: 17/004,179

(22) Filed: Aug. 27, 2020

(65) Prior Publication Data

US 2021/0063970 A1    Mar. 4, 2021

(30) Foreign Application Priority Data

Aug. 28, 2019   (JP) .............................. JP2019-155541

(51) Int. Cl.
*G04F 5/14* (2006.01)
*H03B 17/00* (2006.01)
*H03L 7/26* (2006.01)

(52) U.S. Cl.
CPC ............. *G04F 5/145* (2013.01); *H03B 17/00* (2013.01); *H03L 7/26* (2013.01)

(58) Field of Classification Search
CPC ............ G04F 5/145; H03B 17/00; H03L 7/26
USPC .................................................. 331/3, 94.1
See application file for complete search history.

(56) References Cited

U.S. PATENT DOCUMENTS

| | | | |
|---|---|---|---|
| 2013/0230673 A1 | 9/2013 | Nagasaka et al. | |
| 2015/0369427 A1 | 12/2015 | Nagasaka | |
| 2017/0244419 A1 | 8/2017 | Hayashi et al. | |
| 2018/0143265 A1 | 5/2018 | Nagasaka et al. | |
| 2018/0241408 A1* | 8/2018 | Hayashi | ............ H01L 29/66977 |

FOREIGN PATENT DOCUMENTS

| | | |
|---|---|---|
| JP | 2013-181941 A | 9/2013 |
| JP | 2016-008836 A | 1/2016 |
| JP | 2017-147402 A | 8/2017 |
| JP | 2017-152676 A | 8/2017 |
| JP | 2018-084452 A | 5/2018 |
| WO | 2016-031707 A1 | 3/2016 |

OTHER PUBLICATIONS

A. Matsumoto, "Solid Phase Polymerization", Organic Crystals, Aug. 2, 2007, (7 pages), with English translation.
M.A. Bouchait et al., "Relaxation of Optically Pumped Rb Atoms on Paraffin-Coated Walls", Physical Review, vol. 147, No. 1, pp. 14-54, Nov. 22, 1965.
Y. Okawa et al., "Domino Effects on Surfaces—STM Induced Chain Polymerization-", Surface and Interface Laboratory, Japan, Jul. 25, 2002, pp. 1-11.
S. Yamada et al., "Surface Structure and Molecular Orientation of Polydiacetylene Monolayer", Department of Electrical Engineering, Japan, Kobunshi Ronbunshu, vol. 55, No. 4, pp. 157-170, Apr. 1988, with English translation.

* cited by examiner

*Primary Examiner* — Arnold M Kinkead

(74) *Attorney, Agent, or Firm* — Harness, Dickey & Pierce, P.L.C.

(57) ABSTRACT

A quantum interference device includes a light emitting element; and an atomic cell on which light from the light emitting element is incident. The atomic cell accommodates alkali metal atoms therein, and a coating film containing a polydiyne compound or a polydiene compound is disposed on an inner wall of the atomic cell.

8 Claims, 10 Drawing Sheets

QUANTUM INTERFERENCE DEVICE

The present application is based on, and claims priority from JP Application Serial Number 2019-155541, filed Aug. 28, 2019, the disclosure of which is hereby incorporated by reference herein in its entirety.

BACKGROUND

1. Technical Field

The present disclosure relates to a quantum interference device.

2. Related Art

Alkali metal atoms such as cesium exhibit a phenomenon such as spin polarization and Coherent Population Trapping (CPT) under an action of light. In a quantum interference device such as an atomic oscillator or a magnetic sensor, the phenomenon is utilized in the alkali metal atoms enclosed inside a gas cell. For this reason, a relaxation prevention film is provided on an inner wall of the gas cell in order to prevent relaxation of the phenomenon.

JP-A-2016-8836 discloses a gas cell in which paraffin having a long-chain molecular structure is formed on an inner wall to form a coating layer. By vertically orienting the long chain molecular structure with respect to the inner wall, an effect of relaxing the spin polarization is achieved.

A coating layer described in JP-A-2016-8836 has a problem of low heat resistance. When the heat resistance is low, the coating layer tends to deteriorate when a temperature of the gas cell increases. As a result, there is a concern that a performance that prevents the relaxation of the above-mentioned phenomenon such as the spin polarization and the CPT may be deteriorated.

SUMMARY

A quantum interference device according to an application example of the present disclosure includes a light emitting element; and an atomic cell on which light from the light emitting element is incident. The atomic cell accommodates alkali metal atoms therein, and a coating film containing a polydiyne compound or a polydiene compound is disposed on an inner wall thereof.

DESCRIPTION OF EXEMPLARY EMBODIMENTS

Hereinafter, preferred embodiments of a quantum interference device according to the present disclosure will be described in detail with reference to the accompanying drawings.

1. First Embodiment

First, an atomic oscillator 1 which is a quantum interference device according to a first embodiment will be described.

Figure 1:
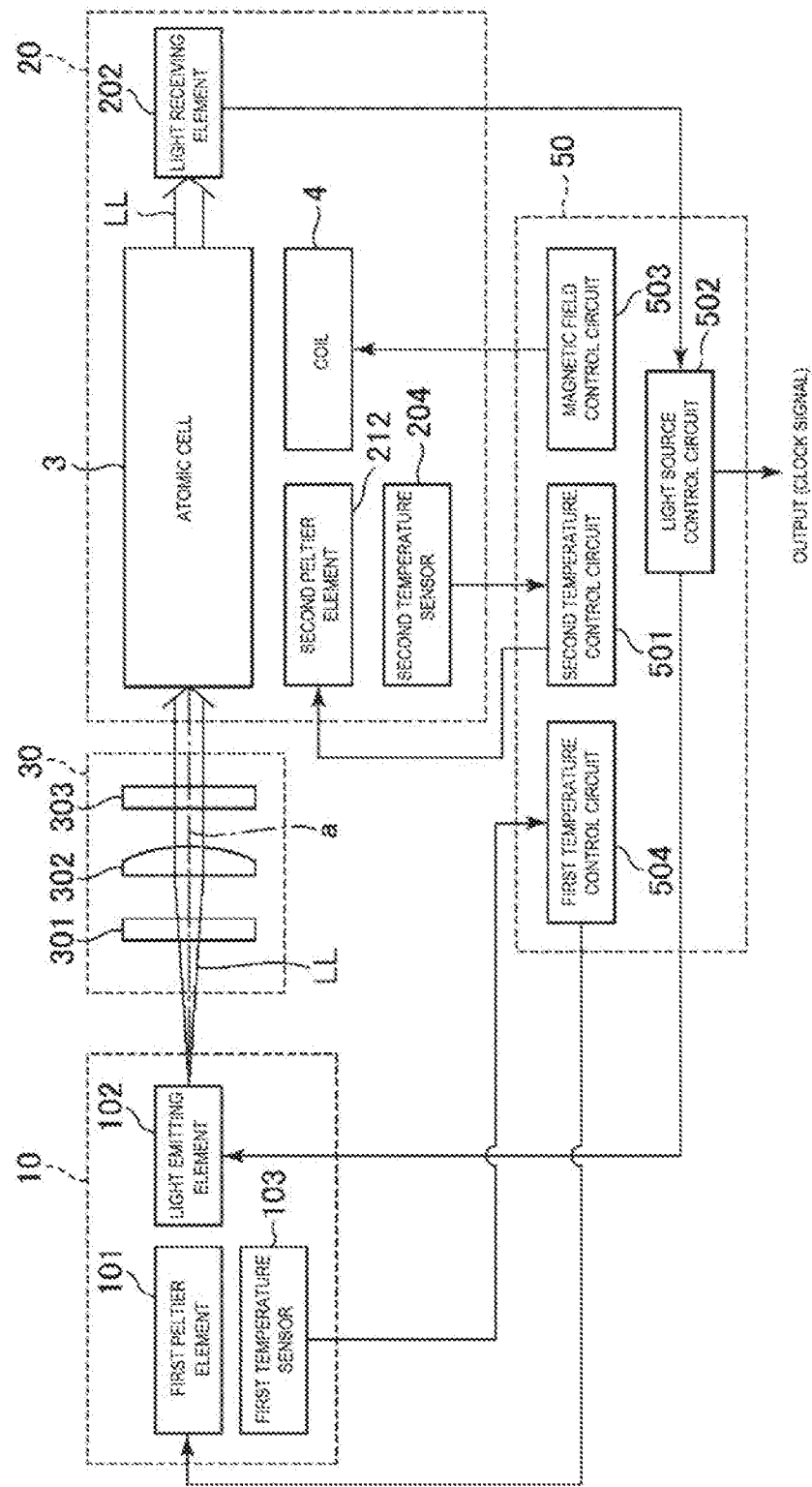
FIG. 1 is a functional block diagram showing an atomic oscillator which is a quantum interference device according to a first embodiment.
Figure 2:
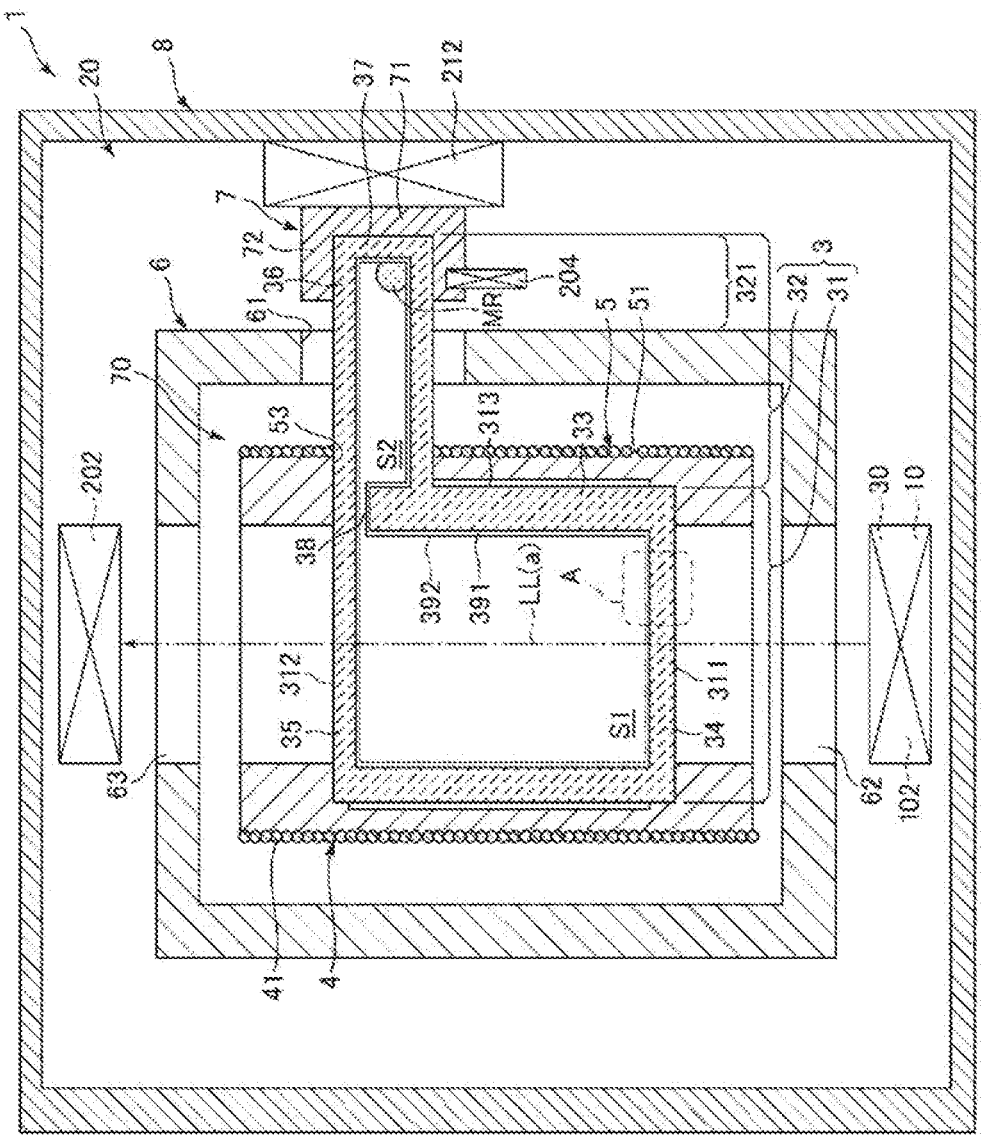
FIG. 2 is a cross-sectional view of a main part of the atomic oscillator shown in FIG. 1.

FIG. 1 is a functional block diagram showing the atomic oscillator 1 which is the quantum interference device according to the first embodiment. FIG. 2 is a cross-sectional view of a main part of the atomic oscillator 1 shown in FIG. 1. In FIG. 2, three axes orthogonal to one another are defined as an X axis, a Y axis, and a Z axis. The X axis is parallel to an optical axis a to be described below. The Y axis is parallel to a long axis of a second chamber 32 of an atomic cell 3 to be described below. A direction indicated by an arrow of each axis is referred to as a "positive direction", and an opposite direction thereof is referred to as a "negative direction". As an example, an X axis positive direction is a traveling direction of light LL.

1.1 Atomic Oscillator

The atomic oscillator 1 is an oscillator using a quantum interference effect. The quantum interference effect causes a phenomenon in which, when alkali metal atoms are simultaneously irradiated with two kinds of resonance light having different frequencies, the two kinds of resonance light are transmitted through the alkali metal atoms without being absorbed. The phenomenon is called a CPT phenomenon or an Electromagnetically Induced Transparency phenomenon (EIT phenomenon). A highly accurate oscillator is implemented by utilizing the phenomenon in the atomic oscillator 1.

As shown in FIG. 1, the atomic oscillator 1 includes a light emitting element module 10, an atomic cell unit 20, an optical system unit 30 provided between the light emitting element module 10 and the atomic cell unit 20, and a control circuit 50 that controls operation of the light emitting element module 10 and the atomic cell unit 20. Hereinafter, each part of the atomic oscillator 1 will be described.

The light emitting element module 10 includes a first Peltier element 101, a light emitting element 102, and a first temperature sensor 103. The light emitting element 102 emits linearly polarized light LL including two kinds of resonance light having different frequencies. The light emitting element 102 is not particularly limited as long as the light emitting element 102 emits the light LL, and for example, a semiconductor laser such as a Vertical Cavity Surface Emitting Laser (VCSEL) or the like can be used. The first temperature sensor 103 detects a temperature of the light emitting element 102. The first Peltier element 101 heats or cools the light emitting element 102 and adjusts the temperature of the light emitting element 102.

The optical system unit 30 includes a neutral density filter 301, a condensing lens 302, and a quarter-wave plate 303, which are arranged adjacently along an optical axis a of the light LL. The neutral density filter 301 reduces intensity of the light LL from the light emitting element 102. The condensing lens 302 adjusts an emission angle of the light LL so as to make the light LL close to parallel light, for example. The quarter-wave plate 303 converts the light LL from linearly polarized light to circularly polarized light, specifically, right-circularly polarized light or left-circularly polarized light.

The atomic cell unit 20 includes the atomic cell 3, a light receiving element 202, a second Peltier element 212, a second temperature sensor 204, and a coil 4.

The atomic cell 3 has transmittivity to the light LL. As will be described in detail below, the atomic cell 3 has a first chamber 31 and the second chamber 32, and an internal space S1 of the first chamber 31 and an internal space S2 of the second chamber 32 are surrounded by an inner wall 391. Alkali metal atoms are enclosed in the internal space S1 and the internal space S2 of the atomic cell 3. The alkali metal atoms have a three-level system energy level formed of two ground levels different from each other and an excitation level. The light LL from the light emitting element 102 enters the atomic cell 3 through the neutral density filter 301, the condensing lens 302, and the quarter-wave plate 303. Then, the light receiving element 202 receives the light LL that passes through the atomic cell 3, and outputs a signal corresponding to the received light intensity.

The second Peltier element 212 is a temperature control element that controls a temperature of the atomic cell 3 to be described below. The second Peltier element 212 performs heating or cooling function in accordance with a direction of a current to be supplied. The second temperature sensor 204 detects the temperature of the atomic cell 3.

The coil 4 applies a magnetic field in a predetermined direction to the alkali metal atoms in the atomic cell 3 to cause the energy level of the alkali metal atoms to undergo Zeeman splitting. Thus, in a state where the energy level of the alkali metal atoms undergoes Zeeman splitting, when the alkali metal atoms are irradiated with a resonance light pair of the circularly polarized light as described above, the number of alkali metal atoms having a desired energy level can be relatively increased with respect to the number of alkali metal atoms having other energy levels among a plurality of Zeeman splitting levels of alkali metal atoms. Therefore, it is possible to increase the number of desired atoms that exhibit a CPT phenomenon (EIT phenomenon), and to increase desired signals, that is, signals appearing in output signals of the light receiving element 202 along with the CPT phenomenon. As a result, it is possible to improve oscillation characteristics of the atomic oscillator 1, particularly short-term frequency stability.

The control circuit 50 includes a first temperature control circuit 504, a light source control circuit 502, a magnetic field control circuit 503, and a second temperature control circuit 501. The first temperature control circuit 504 controls, based on a detection result of the first temperature sensor 103, energization of the first Peltier element 101 in order to make the temperature of the light emitting element 102 be a desired temperature. The second temperature control circuit 501 controls, based on a detection result of the second temperature sensor 204, energization of the second Peltier element 212 in order to make the inside of the atomic cell 3 be a desired temperature. The magnetic field control circuit 503 controls energization of the coil 4 in order to make the magnetic field generated by the coil 4 constant.

The light source control circuit 502 controls, based on a detection result of the light receiving element 202, the frequencies of the two kinds of resonance light included in the light LL from the light emitting element 102 in order to cause occurrence of the CPT phenomenon (EIT phenomenon). Specifically, when a frequency difference between the two kinds of resonance light corresponds to an energy difference between the two ground levels of the alkali metal atoms in the atomic cell 3, the CPT phenomenon occurs.

Next, a configuration of the atomic cell unit 20 which is the main part of the atomic oscillator 1 will be described in detail.

As described above, the atomic cell unit 20 includes the atomic cell 3, the light receiving element 202, the second Peltier element 212, the second temperature sensor 204, and the coil 4. As shown in FIG. 2, the atomic cell 3 includes the first chamber 31 and the second chamber 32. The atomic cell unit 20 shown in FIG. 2 includes a support member 5 that supports the coil 4, a first shield member 6 that accommodates the first chamber 31 of the atomic cell 3, the coil 4, and the support member 5, and a heat transfer member 7 abutted with the second chamber 32 of the atomic cell 3 and the second Peltier element 212. The atomic oscillator 1 further includes a second shield member 8 that accommodates the atomic cell unit 20, the light emitting element module 10, and the optical system unit 30.

The atomic cell 3 includes the first chamber 31 accommodating gas alkali metal and the second chamber 32 accommodating solid or liquid alkali metal together with the gas alkali metal. Gas, liquid and solid alkali metals are sometimes collectively referred to as the alkali metal atoms in the present description. The liquid and solid alkali metals are also referred to as "supplementary metal MR".

Examples of the alkali metal include rubidium, cesium, and sodium, or the like.

The first chamber 31 has a tubular body 33 having a central axis parallel to the X axis, a plate-shaped window 34 bonded to an X axis negative side of the body 33, a plate-shaped window 35 bonded to an X axis positive side of the body 33 and the internal space S1 surrounded by the above components. The light LL emitted from the light emitting element 102 sequentially passes through the window 34, the internal space S1, and the window 35. At this time, the light LL can excite the alkali metal atoms in the internal space S1. Thereafter, the light LL reaches the light receiving element 202. A shape of the internal space S1 is not particularly limited, and examples thereof include, for example, a rectangular parallelepiped, a cube, a cylinder, a sphere, and the like. One of the windows 34 and 35 of the atomic cell 3 may be integrated with the body 33.

The first chamber 31 has opposite-side surfaces from the internal space S1, that is, a first surface 311, a second surface 312, and a third surface 313 as an outer surface of the atomic cell 3. The first surface 311 is an outer surface of the window 34, and is an incident surface on which the light LL from the light emitting element 102 is incident. The second surface 312 is an outer surface of the window 35, and is an emission surface from which the light LL that enters the first surface 311 and transmitted through the internal space S1 emits. The third surface 313 is an outer peripheral surface of the body 33 and connects the first surface 311 and the second surface 312. When an outer shape of the body 33 is a prism or the like and includes a plurality of surfaces, the surfaces are collectively referred to as the third surface 313.

Constituent materials of the window 34 and the window 35 are not particularly limited as long as the material has transparency to the light LL, and examples thereof include a glass material, a quartz crystal, and the like. On the other hand, examples of the constituent material of the body 33 include quartz glass, borosilicate glass, silicon, quartz crystal, and the like. Examples of a method of bonding the body 33, the window 34 and the window 35 include a direct bonding method, an anodic bonding method, a fusion bonding method, an optical bonding method, and the like.

The second chamber 32 protrudes from the third surface 313 toward a Y axis positive direction. The second chamber 32 has a tubular body 36 having a central axis parallel to the Y axis, a lid 37 provided on a Y axis positive side of the body 36, and the internal space S2 surrounded by the above components. The body 36 has a shape having a long axis parallel to the Y axis. The supplementary metal MR is accommodated in the internal space S2. The internal space S2 communicates with the internal space S1 via a communication path 38. Accordingly, when partial pressure of the gas alkali metal accommodated in the internal space S1 is reduced, the supplementary metal MR becomes a gas and is supplied into the internal space S1. In this manner, the second chamber 32 functions as a reservoir that stores the supplementary metal MR.

Constituent materials of the body 36 and the lid 37 are not particularly limited, and examples thereof include a metal material, a glass material, a silicon material, a quartz crystal, and the like. Examples of a method of bonding the body 36 and the body 33 include a direct bonding method, an anodic bonding method, a fusion bonding method, an optical bonding method, and the like. The lid 37 is manufactured together with the body 36 by fusing an end of a tubular base material for obtaining the body 36 and sealing the end. The lid 37 is prepared as a member separate from the body 36, and can also be manufactured by a method of bonding the member to the body 36.

On a second surface 312 side of the atomic cell 3 configured as described above, the light receiving element 202 is disposed to face the second surface 312. The light receiving element 202 can detect intensity of the light LL that passes through the atomic cell 3 and emitted from the second surface 312, that is, the resonant light pair. The light receiving element 202 is not particularly limited, and examples thereof include a photodiode, and the like.

The tubular support member 5 is disposed concentrically with the body 33 on the outer periphery of the body 33 of the atomic cell 3. The support member 5 is a member that supports the atomic cell 3 on an inner side thereof and supports the coil 4 on an outer side thereof.

The spiral coil 4 is disposed on an outer peripheral surface 51 of the support member 5. The support member 5 has a through hole 53 penetrating along the Y axis. The second chamber 32 of the atomic cell 3 is inserted into the through hole 53.

A constituent material of the support member 5 is not particularly limited, and for example, a material that does not inhibit a magnetic field from the coil 4 to the atomic cell 3, for example, a non-magnetic metal material such as aluminum, or a thermally conductive ceramic material such as a silicon carbide can be used.

The coil 4 is configured by wires 41 spirally wound along the outer peripheral surface 51 of the support member 5. The number of the wires 41 constituting the coil 4 is not limited to one, and may be plural.

The first shield member 6 has magnetic shielding property. Accordingly, it is possible to shield the magnetic field in a use environment of the atomic oscillator 1 toward the atomic cell 3, and it is possible to reduce fluctuation of the magnetic field in the first chamber 31.

The first shield member 6 has a through hole 61 penetrating along the Y axis. The second chamber 32 of the atomic cell 3 is inserted into the through hole 61. Accordingly, a front end 321 of the second chamber 32 is located outside the first shield member 6. As a result, temperature control for the second chamber 32 becomes easy. The front end 321 of the second chamber 32 may be located inside the first shield member 6, or the entire second chamber 32 may be located outside the first shield member 6.

In addition, an opening 62 and an opening 63 penetrating along the X axis are formed in two walls intersecting with the X axis of the first shield member 6. The opening 62 is located on the X axis negative side with respect to the opening 63, and the light LL incident on the first surface 311 of the atomic cell 3 passes through. On the other hand, the opening 63 is located on the X axis positive side with respect to the opening 62, and the light LL emitted from the second surface 312 passes through.

A constituent material of the first shield member 6 is not particularly limited, and it is preferable to use, for example, an iron-based alloy having relatively high magnetic permeability such as iron, kovar, permalloy, and stainless steel.

In the present embodiment, a gap is formed between the support member 5 and the first shield member 6, and the gap functions as a heat insulating layer 70 having heat insulating property.

The second shield member 8 has a box shape, and collectively accommodates the atomic cell unit 20, the light emitting element module 10 and the optical system unit 30 therein. The second shield member 8 has magnetic shielding property. Therefore, it possible to compensate for shielding property of the magnetic field in the first shield member 6.

A constituent material of the second shield member 8 is not particularly limited, and for example, the same material as the constituent material of the first shield member 6 can be used.

The second Peltier element 212 and the heat transfer member 7 are disposed between the second shield member 8 and the atomic cell 3. The second Peltier element 212 is located on a second shield member 8 side with respect to the heat transfer member 7, and the heat transfer member 7 is abutted with a surface of the second Peltier element 212 on an atomic cell 3 side. The second temperature sensor 204 is supported and fixed to the heat transfer member 7.

Thus, the atomic oscillator 1 includes the second Peltier element 212 as the temperature control element for controlling the temperature of the second chamber 32. The second Peltier element 212 performs a heating function or a cooling function in accordance with the direction of the current to be supplied, and adjusts the inside of the second chamber 32 to a desired temperature.

The heat transfer member 7 is disposed so as to cover the front end 321 of the second chamber 32 of the atomic cell 3 from a lid 37 side. The heat transfer member 7 includes a first abutting portion 71 abutted with the lid 37 of the second chamber 32, and a second abutting portion 72 abutted with a part of the body 36 of the second chamber 32. The first abutting portion 71 is also abutted with the second Peltier element 212 on an opposite side from the lid 37.

A constituent material of the heat transfer member 7 is not particularly limited, and examples thereof include copper, aluminum, and the like.

The second temperature sensor 204 is disposed in the second abutting portion 72 of the heat transfer member 7. The second temperature sensor 204 is a temperature detection element that detects the temperature of the second chamber 32. Examples of the second temperature sensor 204 include a thermistor, a thermocouple, and the like.

1.2 Atomic Cell

Figure 3:
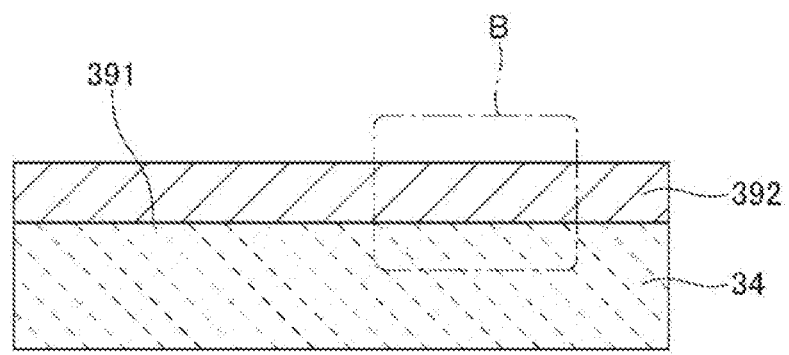
FIG. 3 is an enlarged view of part A of FIG. 2.
Figure 4:
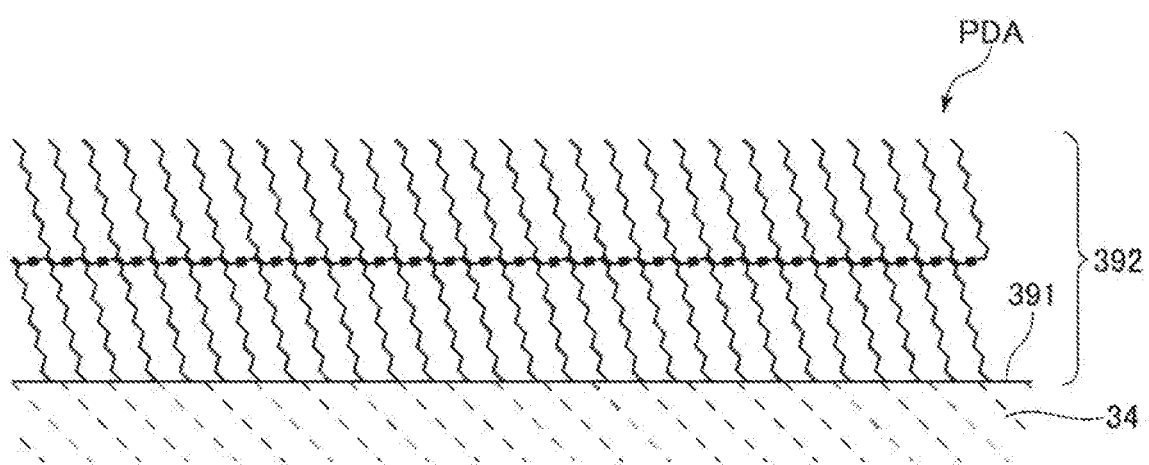
FIG. 4 is an enlarged view of part B of FIG. 3.
Figure 5:
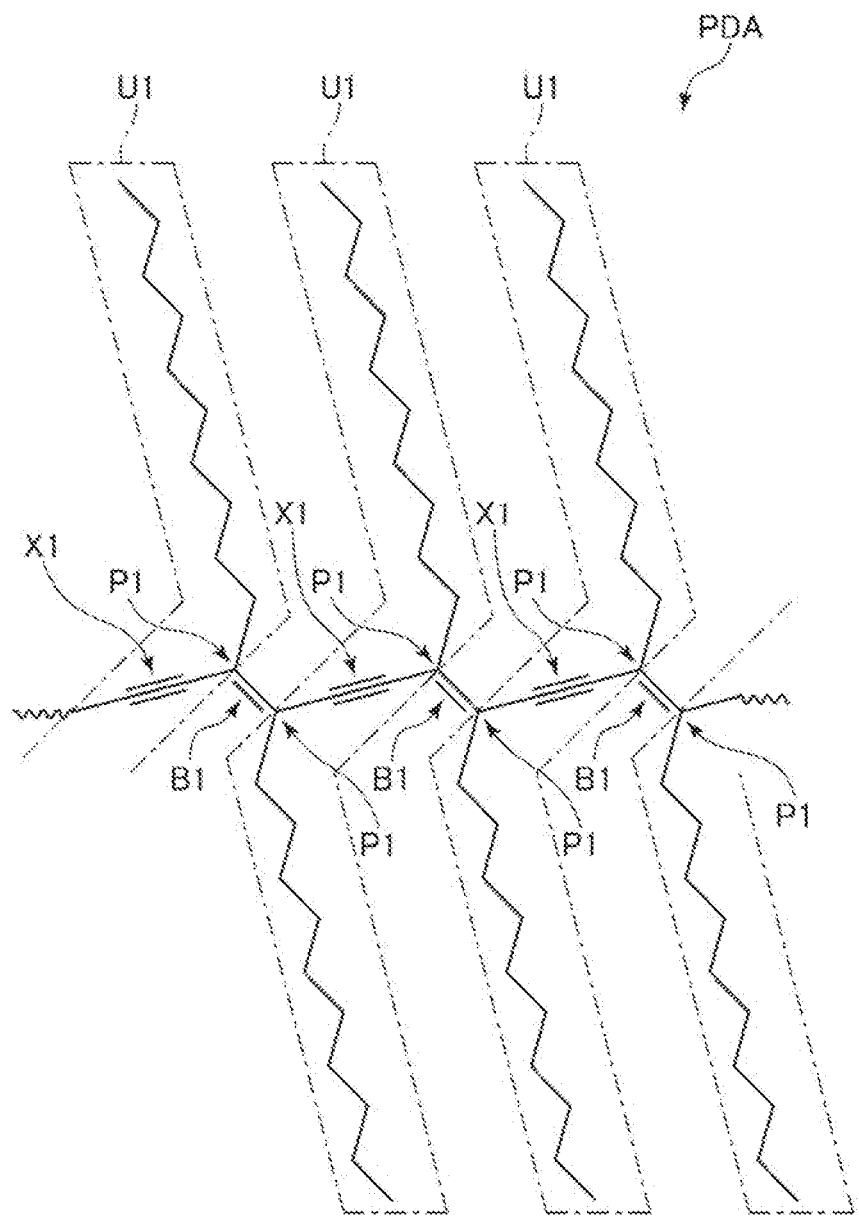
FIG. 5 is a diagram showing a part of an example of a molecular structure of a polydiacetylene compound contained in a coating film shown in FIG. 4.
Figure 6:
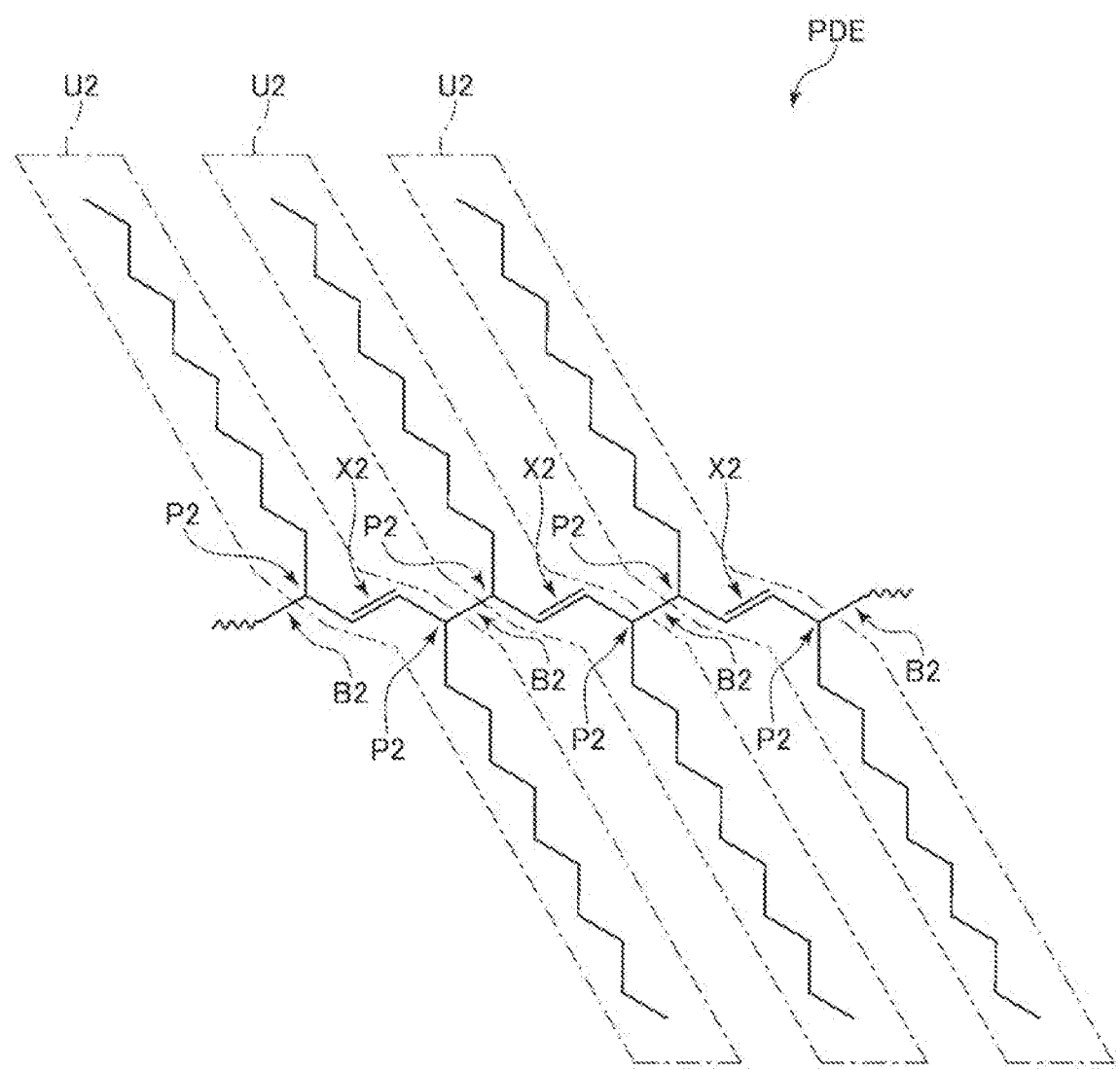
FIG. 6 is a diagram showing a part of a molecular structure of a polydiene compound contained in the coating film shown in FIG. 4.

FIG. 3 is an enlarged view of part A of FIG. 2. FIG. 4 is an enlarged view of part B of FIG. 3. FIG. 5 is a diagram showing a part of an example of a molecular structure of a polydiacetylene compound PDA, which is a kind of polydiyne compound PDY contained in a coating film 392 shown in FIG. 4. FIG. 6 is a diagram showing a part of an example of a molecular structure of a polydiene compound PDE contained in the coating film 392 shown in FIG. 4.

As described above, the atomic cell 3 accommodates the alkali metal atoms. As shown in FIG. 3, the atomic cell 3 has the coating film 392 provided on the surface of the inner wall 391. The coating film 392 contains the polydiacetylene compound PDA shown in FIGS. 4 and 5 or the polydiene compound PDE shown in FIG. 6. By providing the coating film 392, it is possible to prevent the relaxation of the CPT phenomenon generated in the alkali metal atoms accommodated in the internal space S1 of the atomic cell 3. The coating film 392 containing the polydiacetylene compound PDA or the polydiene compound PDE is formed, for example, by polymerizing polymerizable monomers and crosslinking monomers, as will be described below. For this reason, monomer-derived unit structures are crosslinked by a covalent bond, so that the coating film 392 stronger than that in the related art can be formed. As a result, the heat resistance of the coating film 392 can be enhanced.

Here, the polydiacetylene compound PDA is a polymer in which an unsaturated organic molecule containing two triple bonds is set as a monomer. The unsaturated organic molecule is a diacetylene compound and is represented by the following Formula (1).

$$R_1C\equiv CC\equiv CR_2 \quad (1)$$

In Formula (1), $R_1$ and $R_2$ are substituents respectively.

The triple bonds contained in the above Formula (1) are cleaved by application of energy to cause solid phase polymerization, and a polydiacetylene compound PDA is obtained. The polydiacetylene compound PDA is a polydiyne compound PDY having one single bond between two triple bonds. Although the polydiacetylene compound PDA is representatively described in the present description, the polydiyne compound PDY having two or more single bonds may be used instead of the polydiacetylene compound PDA. In addition, the polydiyne compound PDY having two or more structures ($C\equiv CC\equiv C$) that causes the solid phase polymerization as in the above Formula (1) may be used.

The polydiene compound PDE is a polymer in which an unsaturated organic molecule containing two double bonds is set as a monomer. The unsaturated organic molecule is a diene compound and is represented by the following Formula (2).

$$R_1C=CC=CR_2 \quad (2)$$

In Formula (2), $R_1$ and $R_2$ are substituents respectively.

The double bonds contained in the above Formula (2) are cleaved by application of energy to cause solid phase polymerization, and a polydiene compound PDE is obtained. The polydiene compound PDE may be a polydiene compound having two or more single bonds between two double bonds. The polydiene compound having two or more structures ($C=CC=C$) that cause the solid phase polymerization as in the above Formula (2) may be used.

Here, the monomer-derived unit structure in the polydiacetylene compound PDA is defined as U1. The monomer-derived unit structure in the polydiene compound PDE is defined as U2. As shown in FIGS. 5 and 6, unit structures U1 and U2 are repeating unit structures in the polymer. The unit structures U1 and U2 shown in FIGS. 5 and 6 have a long chain shape, and along axis thereof is oriented substantially perpendicular to the inner wall 391. The vertical orientation includes not only a state where the long axis of the unit structure U1 and the surface of the inner wall 391 are orthogonal to each other, but also a state where deviation from the state is a predetermined amount or less, for example, 45° or less.

In particular, the polydiacetylene compound PDA has a π-conjugated structure, while the polydiene compound PDE does not have a π-conjugated structure. In this case, the latter can reduce a degree of coloring of the coating film 392 as compared with the former. A wavelength of the light LL transmitted through the coating film 392 is less likely to change, which can contribute to further higher accuracy of the atomic oscillator 1.

The unit structure U1 is coupled to the adjacent unit structure U1 via a crosslinking part B1. That is, the polydiacetylene compound PDA is a polymer in which the monomer-derived unit structures U1 are crosslinked at the crosslinking part B1. The crosslinking part B1 may be located at a position other than a center of the unit structure U1. In the present embodiment, as shown in FIG. 5, crosslinking parts B1 are located at the centers of the unit structures U1.

Similarly, the unit structure U2 is coupled to the adjacent unit structure U2 via a crosslinking part B2. That is, the polydiene compound PDE is a polymer in which the monomer-derived unit structures U2 are crosslinked at the crosslinking part B2. The crosslinking part B2 may be located at a position other than a center of the unit structure U2. In the present embodiment, as shown in FIG. 6, the crosslinking parts B2 are located at the centers of the unit structures U2.

Since the crosslinking parts B1 and B2 are located at the centers of the unit structures U1 and U2, polymerization probability can be increased when the monomers are polymerized to form the polydiacetylene compound PDA or the polydiene compound PDE. The crosslinking part B1 is located at the center of the unit structure U1 means that the positions of the two triple bonds contained in the diacetylene compound, which is the monomer before polymerization, are substantially at the center of a molecular length of the diacetylene compound. The crosslinking part B2 is located at the center of the unit structure U2 means that the positions of the two double bonds contained in the diene compound, which is the monomer before polymerization, are substantially at the center of a molecular length of the diene compound. Therefore, when the diacetylene compound is oriented along the inner wall 391, or when the diene compound is oriented along the inner wall 391, constraints on polymerizable postures of the respective molecules are reduced. In other words, a polymerization reaction easily occurs regardless of the orientation of the molecules. As a result, the polymerization reaction occurs at higher probability, and the dense coating film 392 with few gaps can be efficiently manufactured.

The center of the unit structure U1 refers to a middle position in the length along the long axis of the unit structure U1. Specifically, as shown in FIG. 5, the unit structure U1 of the polydiacetylene compound PDA includes a site X1 having a carbon-carbon triple bond and carbon-carbon single bonds located on both sides of the carbon-carbon triple bond. Further, the crosslinking part B1 formed of the carbon-carbon single bond and responsible for crosslinking with the adjacent unit structure U1, is bonded to the carbon atoms at both ends of the site X1. In the site X1, the carbon atoms to which the crosslinking part B1 is bonded are defined as crosslinking points P1. The unit structure U1 includes two crosslinking points P1 and P1 at which the crosslinking part B1 is bonded. Therefore, in the case of the polydiacetylene compound PDA, in the unit structure U1, if the number of carbon-carbon single bonds located at one end of the unit structure U1 rather than the site X1 is equal to the number of carbon-carbon single bonds located at the other end of the unit structure U1, or a difference therebetween is one, it can be said that the crosslinking part B1 is crosslinked at the center of the unit structure U1. In other words, it can be said that the site X1 is located at the center of the unit structure U1.

Similarly, the center of the unit structure U2 refers to a middle position in the length along the long axis of the unit structure U2. Specifically, as shown in FIG. 6, the unit structure U2 of the polydiene compound PDE includes a site X2 having a carbon-carbon double bond and carbon-carbon single bonds located on both sides of the carbon-carbon double bond. Further, the crosslinking part B2 formed of the carbon-carbon single bond, and responsible for crosslinking with the adjacent unit structure U2, is bonded to the carbon atoms at both ends of the site X2. In the site X2, the carbon atoms to which the crosslinking part B2 is bonded are defined as crosslinking points P2. The unit structure U2 includes two crosslinking points P2 and P2 at which the crosslinking part B2 is bonded. Therefore, in the case of the polydiene compound PDE, in the unit structure U2, if the number of carbon-carbon single bonds located on one end of the unit structure U2 rather than the site X2 is equal to the number of carbon-carbon single bonds located on the other end of the unit structure U2, or a difference therebetween is one, it can be said that the crosslinking part B2 is crosslinked at the center of the unit structure U2. In other words, it can be said that the site X2 is located at the center of the unit structure U2.

A diyne compound having two or more structures (C≡CC≡C) that cause the solid phase polymerization as in the above Formula (1) becomes a polydiyne compound including four or more crosslinking points P1 when being polymerized. For example, when the diyne compound having two structures that cause the solid phase polymerization is polymerized, the unit structure U1 of the obtained polydiyne compound is a structure including an intermediate portion constituted by two carbon-carbon triple bonds and a carbon-carbon single bond connecting the carbon-carbon triple bonds. Then, this intermediate portion is located at the above-described "center of the unit structure U1". Therefore, in this case, the similar effect as the effect brought about by the fact that "the site X1 is located at the center" is also obtained. The effect is similarly obtained when the diyne compound having three or more structures that cause the solid phase polymerization is used.

In addition, the diene compound having two or more structures (C=CC=C) that cause the solid phase polymerization as in the above Formula (2) becomes a polydiene compound including four or more crosslinking points P2 when being polymerized. For example, when the diene compound having two structures that cause the solid phase polymerization is polymerized, the unit structure U2 of the obtained polydiene compound is a structure including an intermediate portion constituted by two carbon-carbon double bonds and a carbon-carbon single bond connecting the carbon-carbon double bonds. Then, this intermediate portion is located at the above-described "center of the unit structure U2". Therefore, in this case, the similar effect as the effect brought about by the fact that "the site X2 is located at the center" is also obtained. The effect is similarly obtained when the diene compound having three or more structures that cause the solid phase polymerization is used.

The substituents $R_1$ of the unit structures U1 and U2 are physically or chemically adsorbed to the inner wall 391. A bonding force between the inner wall 391 and the unit structures U1 and U2 may be a chemical bonding force, or may be a physical bonding force such as van der Waals force. On the other hand, the substituents $R_2$ of the unit structures U1 and U2 are directed to the inside of the internal spaces S1 and S2. Therefore, the alkali metal atoms are less likely to stay on the surface of the coating film 392.

The number of carbons in the unit structures U1 and U2 is preferably 20 or more and 60 or less, and more preferably 25 or more and 55 or less. By setting the number of carbons within the range, a film thickness of the coating film 392 can be sufficiently ensured. Thus, it possible to further enhance the performance of preventing the relaxation of the CPT phenomenon. Therefore, when the number of carbons in the unit structures U1 and U2 is less than a lower limit value, the relaxation of the CPT phenomenon may not be prevented sufficiently. On the other hand, when the number of carbons in the unit structure U1, U2 exceeds an upper limit value, since the long axes of the unit structures U1 and U2 are too long, for example, when the unit structures U1 and U2 are vertically oriented, it may be difficult to maintain the unit structures U1 and U2. Then, it may be difficult to prevent the relaxation of the CPT phenomenon over a long period of time.

The substituents $R_1$ and $R_2$, which are terminal groups of the polydiyne compound PDY and the polydiene compound PDE, are independent from each other and examples of the substituents $R_1$ and $R_2$ include, for example, a halogen atom, an alkyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group, an ammonio group, acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinylamino group, a phosphono group, a silyl group, a hydrazino group, an ureido group, a boronic acid group ($-B(OH)_2$), a phosphato group ($-OPO(OH)_2$), a sulfato group ($-OSO_3H$) and other known substituents. The substituents may be further substituted with the substituent. The alkyl group includes a cycloalkyl group, a bicycloalkyl group, and a tricycloalkyl group.

Among these substituents, the substituents $R_1$ and $R_2$ which are terminal groups of the unit structures U1 and U2 are each preferably an alkyl group or a fluorine-containing group, and in particular, the substituent $R_2$ located on the opposite side from the inner wall 391 is more preferably the alkyl group or the fluorine-containing group. Accordingly, surface free energy of the coating film 392 can be made particularly small, and residence time of the alkali metal atoms on the surface of the coating film 392 can be particularly reduced. As a result, the coating film 392 can further enhance the performance of preventing the relaxation of the CPT phenomenon.

The alkyl group may be branched, but is preferably linear from the viewpoint of easily reducing the surface free energy of the coating film 392. The number of carbons in the alkyl group is preferably 1 or more and 20 or less, more preferably 2 or more and 16 or less, and further preferably 8 or more and 14 or less. By setting the number of carbons within the range, a film thickness of the coating film 392 can be sufficiently ensured. Thus, it possible to further enhance the performance of preventing the relaxation of the CPT phenomenon. Therefore, when the number of carbons in the alkyl group is less than a lower limit value, the relaxation of the CPT phenomenon may not be prevented sufficiently. On the other hand, when the number of carbons in the alkyl group exceeds an upper limit value, the alkyl group becomes too long, so that it may be difficult to maintain the unit structures U1 and U2, for example, when the unit structures U1 and U2 are vertically oriented. Then, it may be difficult to prevent the relaxation of the CPT phenomenon over a long period of time.

Examples of the fluorine-containing group include those in which the substituents $R_1$ and $R_2$ are further substituted with a fluorine atom. Particularly, a fluoroalkyl group is preferably used, and a perfluoroalkyl group is more preferably used. The fluoroalkyl group is a group in which at least a part of hydrogen atoms in the alkyl group are substituted with the fluorine atoms, and the perfluoroalkyl group is a group in which all hydrogen atoms in the alkyl group are substituted with the fluorine atoms.

The fluorine-containing group may be branched, but is preferably linear from the viewpoint of easily reducing the surface free energy of the coating film 392. The number of carbons in the fluorine-containing group is preferably 1 or more and 20 or less, more preferably 2 or more and 16 or less, and further preferably 8 or more and 14 or less. By setting the number of carbons within the range, a film thickness of the coating film 392 can be sufficiently ensured. Thus, it possible to further enhance the performance of preventing the relaxation of the CPT phenomenon. Therefore, when the number of carbons in the fluorine-containing group is less than a lower limit value, the relaxation of the CPT phenomenon may not be prevented sufficiently. On the other hand, when the number of carbons in the fluorine-containing group exceeds the upper limit value, the fluorine-containing group becomes too long, so that it may be difficult to maintain the unit structures U1 and U2, for example, when the unit structures U1 and U2 are vertically oriented. Then, it may be difficult to prevent the relaxation of the CPT phenomenon over a long period of time.

The polydiyne compound PDY and the polydiene compound PDE are preferably polymers obtained by topochemical polymerization of monomers. The topochemical polymerization is generally polymerization in which a crystal structure of the polymer to be produced is associated with a crystal structure of the monomer as a raw material. Therefore, in the polymer to be produced by the topochemical polymerization, a crystal system of the crystal is the same as that of a monomer crystal, and a lattice constant is also substantially the same. Therefore, even if the polymerization reaction continues for a long time, a distance from the inner wall 391 to the crosslinking points P1 and P2 is less likely to change, and a stable polymerization reaction is likely to continue. As a result, the homogeneous coating film 392 can be formed. That is, it is possible to form the coating film 392 that is homogeneous and has few crystal grain boundaries. Such a coating film 392 is excellent in heat resistance. Therefore, even when the atomic cell 3 is exposed to a high temperature, the performance of preventing the relaxation of the CPT phenomenon can be maintained particularly well.

The polydiyne compound PDY or the polydiene compound PDE does not need to be entirely topochemically polymerized, and may be partially topochemically polymerized so as to contain a non-topochemical solid phase polycondensation portion.

Examples of the monomer of the polydiyne compound PDY include, for example, 11,13-tetracosadiyne, 13,15-octacosadiyne, and 9,15-tetracosadiyne.

Examples of the monomer of the polydiene compound PDE include, for example, 2,4-hexadiene, 9,15-tetracosadiene, 11,13-tetracosadiene, 13,15-octacosadiene.

The film thickness of the coating film 392 varies depending on composition of the compound and is not particularly limited, and is preferably 1 nm or more and 5000 nm or less, and more preferably 5 nm or more and 1000 nm or less. When the film thickness of the coating film 392 is less than the lower limit value, the relaxation of the CPT phenomenon may not be sufficiently prevented due to the composition of the coating film 392 or the like. On the other hand, when the film thickness of the coating film 392 exceeds the upper limit value, long-term stability of the coating film 392 may decrease depending on the composition of the coating film 392 and the like.

The film thickness of the coating film 392 can be measured based on an observation result of a microscope such as a Transmission Electron Microscope (TEM), a Scanning Tunneling Microscope (STM), or an Atomic Force Microscope (AFM).

As described above, the atomic oscillator 1 as the quantum interference device according to the present embodiment includes the light emitting element 102 and the atomic cell 3 on which the light LL from the light emitting element 102 is incident. Further, the atomic cell 3 accommodates the alkali metal atoms therein, and the coating film 392 containing the polydiyne compound PDY or a polydiene compound PDE is disposed on the inner wall 391.

In such an atomic oscillator 1, since the atomic cell 3 having the coating film 392 having the high heat resistance is provided, the performance of preventing the relaxation of the CPT phenomenon in the alkali metal atoms can be maintained well even when the atomic cell 3 is exposed to the high temperature. Therefore, even when the temperature of the atomic cell 3 increases in operation of the atomic oscillator 1, a manufacturing process, a transportation process, and the like, the CPT phenomenon is less likely to be relaxed. As a result, the atomic oscillator 1 having good heat resistance and excellent reliability can be implemented.

The coating film 392 is preferably disposed on the entire inner wall 391 of the atomic cell 3, and may be disposed on a part of the inner wall 391. For example, the coating film 392 may be provided in at least one of a region intersecting with the X axis, a region intersecting the Y axis, and a region intersecting the Z axis, of the inner wall 391 shown in FIG. 2, and may not be provided in the remaining region. In addition, in each region, the film thickness, composition, and the like of the coating film 392 provided may be different from each other.

1.3 Atomic Cell Manufacturing Method

Next, a method of manufacturing the atomic cell 3 will be described.

Figure 7:
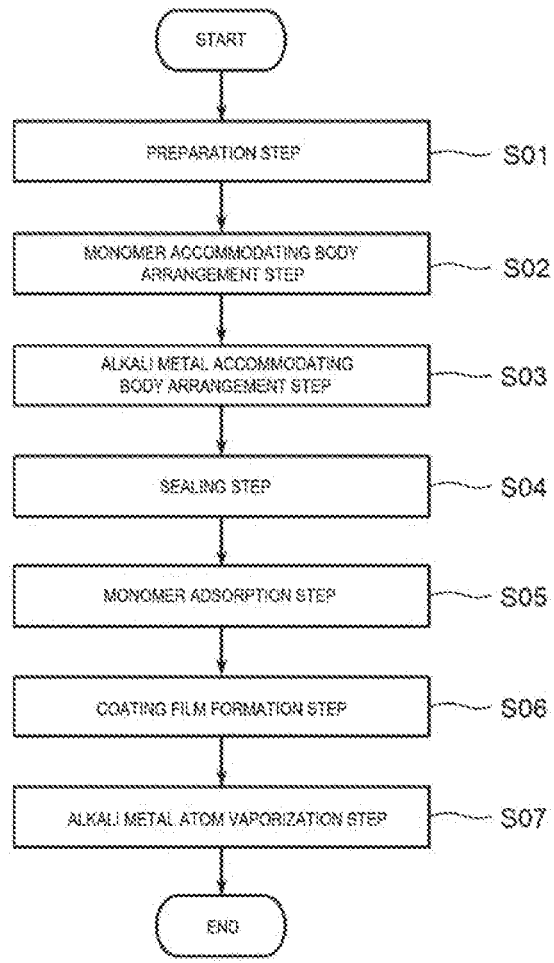
FIG. 7 is a process chart illustrating a method of manufacturing an atomic cell shown in FIG. 2.

FIG. 7 is a process chart for illustrating a method of manufacturing the atomic cell 3 shown in FIG. 2. FIGS. 8 to 14 are cross-sectional views for illustrating the method of manufacturing the atomic cell 3 shown in FIG. 7.

The method of manufacturing the atomic cell 3 shown in FIG. 7 includes a preparation step S01, a monomer accommodating body arrangement step S02, an alkali metal accommodating body arrangement step S03, a sealing step S04, a monomer adsorption step S05, a coating film formation step S06, and an alkali metal atom vaporization step S07. Hereinafter, each step will be described.

1.3.1 Preparation Step S01

Figure 8:
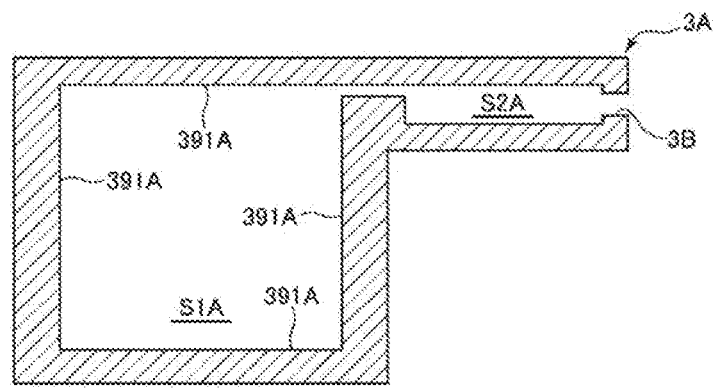
FIG. 8 is a cross-sectional view for illustrating the method of manufacturing the atomic cell shown in FIG. 7.

First, as shown in FIG. 8, an atomic cell container 3A including an opening 3B is prepared. The atomic cell container 3A is a member for forming the atomic cell 3, and includes the opening 3B to be sealed in the sealing step S04 to be described below. The atomic cell container 3A includes an internal space S1A corresponding to the internal space S1 of the atomic cell 3 and an internal space S2A corresponding to the internal space S2.

Next, the internal spaces S1A and S2A of the atomic cell container 3A are depressurized by exhausting air from the opening 3B. At this time, the atomic cell container 3A may be heated. Accordingly, impurities adsorbed on an inner wall 391A of the atomic cell container 3A can be desorbed and removed. As a result, polymerizable monomers 912, which will be described below, are easily aligned, and the dense coating film 392 is easily formed.

1.3.2 Monomer Accommodating Body Arrangement Step S02

Figure 9:
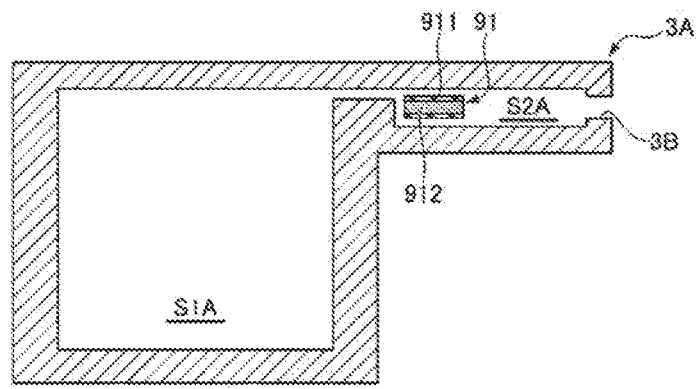
FIG. 9 is a cross-sectional view for illustrating the method of manufacturing the atomic cell shown in FIG. 7.

Next, as shown in FIG. 9, a monomer accommodating body 91 is disposed in the internal space S2A of the atomic cell container 3A via the opening 3B. The monomer accommodating body 91 includes a first container 911 and the polymerizable monomers 912 having polymerizable property accommodated in the first container 911. The polymerizable monomers 912 are the unsaturated organic molecules described above. During the operation, it is preferable to set the internal spaces S1A and S2A of the atomic cell container 3A in an inert gas atmosphere. The arrangement of the monomer accommodating body 91 is not limited to be in the internal space S2A.

The first container 911 is preferably a container having an opening for releasing the vaporized polymerizable monomers 912 in a step to be described below. Examples of a constituent material of the first container 911 include, for example, a glass material, a resin material, and a ceramic material.

1.3.3 Alkali Metal Accommodating Body Arrangement Step S03

Figure 10:
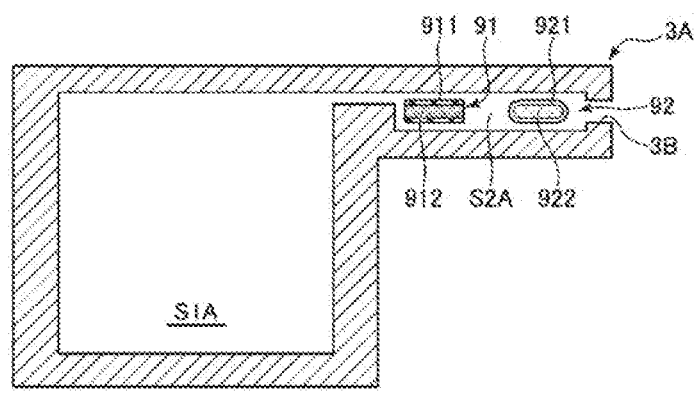
FIG. 10 is a cross-sectional view for illustrating the method of manufacturing the atomic cell shown in FIG. 7.

Next, as shown in FIG. 10, an alkali metal accommodating body 92 is disposed in the internal space S2A of the atomic cell container 3A via the opening 3B. The alkali metal accommodating body 92 includes a second container 921 and alkali metal atoms 922 accommodated in the second container 921. The alkali metal atoms 922 are accommodated in a liquid or solid state, for example. During the operation, it is preferable to set the internal spaces S1A and S2A of the atomic cell container 3A in the inert gas atmosphere. In addition, the arrangement of the alkali metal accommodating body 92 is not limited to be in the internal space S2A.

The second container 921 is preferably a container whose inside is a closed space. Examples of a constituent material of the second container 921 include, for example, a glass material and a resin material.

An order of the step may be exchanged with the monomer accommodating body arrangement step S02.

1.3.4 Sealing Step S04

Figure 11:
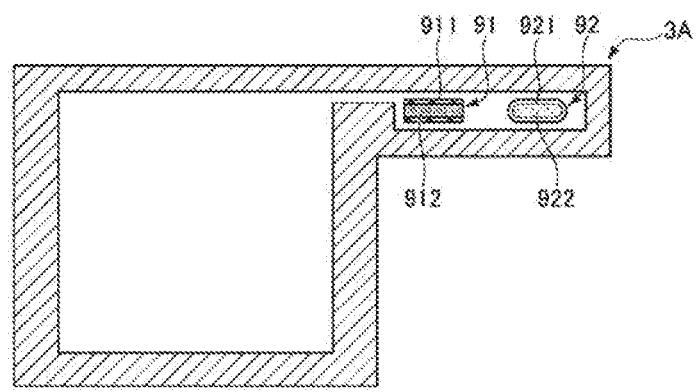
FIG. 11 is a cross-sectional view for illustrating the method of manufacturing the atomic cell shown in FIG. 7.

Next, as shown in FIG. 11, the opening 3B is sealed. The sealing method is not particularly limited. In addition to, for example, fusion sealing that seals the opening 3B by fusing and deforming the periphery of the opening 3B as shown in FIG. 11, the sealing method may be lid sealing that seals the opening 3B by filling the opening 3B with another member, and may be pinch sealing that seals the opening 3B by applying a force to the periphery of the opening 3B to deform the periphery.

1.3.5 Monomer Adsorption Step S05

Figure 12:
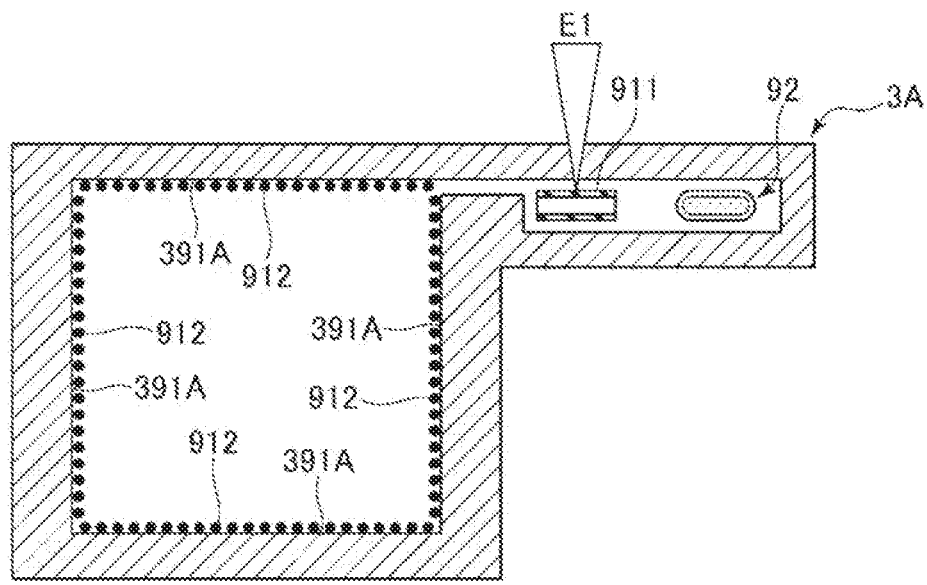
FIG. 12 is a cross-sectional view for illustrating the method of manufacturing the atomic cell shown in FIG. 7.

Next, as shown in FIG. 12, energy is applied from the outside of the atomic cell container 3A toward the monomer accommodating body 91. Accordingly, the polymerizable monomers 912 accommodated in the monomer accommodating body 91 are vaporized. Examples of a method of applying the energy include a method of heating at least a part of the atomic cell container 3A, and a method of emitting an energy beam E1 such as a laser beam.

Thereafter, the atomic cell container 3A is cooled as necessary. Accordingly, the temperature of the polymerizable monomers 912 decreases and crystallizes on the inner wall 391A of the atomic cell container 3A. Accordingly, the polymerizable monomers 912 can be adsorbed to the inner wall 391A.

The polymerizable monomers 912 adsorbed on the inner wall 391A of the atomic cell container 3A are adsorbed while being aligned. In this case, the polymerizable monomer 912 is preferably vertically oriented as described above. Then, the adsorbed polymerizable monomers 912 are vertically oriented one after another, and thus two-dimensional crystallization of the polymerizable monomer 912 proceeds.

1.3.6 Coating Film Formation Step S06

Figure 13:
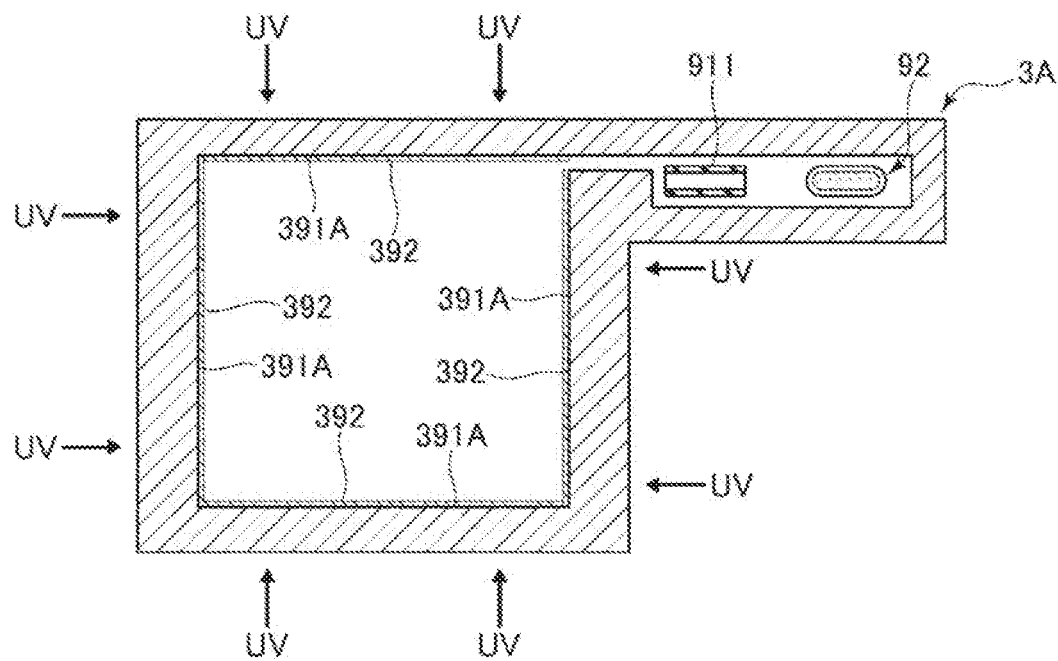
FIG. 13 is a cross-sectional view for illustrating the method of manufacturing the atomic cell shown in FIG. 7.

Next, energy is applied from the outside of the atomic cell container 3A. Accordingly, a polymerization reaction can be caused in the polymerizable monomers 912 adsorbed on the inner wall 391A of the atomic cell container 3A. As a result, as shown in FIG. 13, the coating film 392 is formed on the inner wall 391A of the atomic cell container 3A. The coating film 392, as described above, contains the polydiyne compound PDY or the polydiene compound PDE.

Examples of a method of applying the energy to the atomic cell container 3A include, for example, a method of emitting electromagnetic waves such as visible light and infrared rays in addition to ultraviolet rays UV shown in FIG. 13, and a method of heating the atomic cell container 3A.

1.3.7 Alkali Metal Atom Vaporization Step S07

Figure 14:
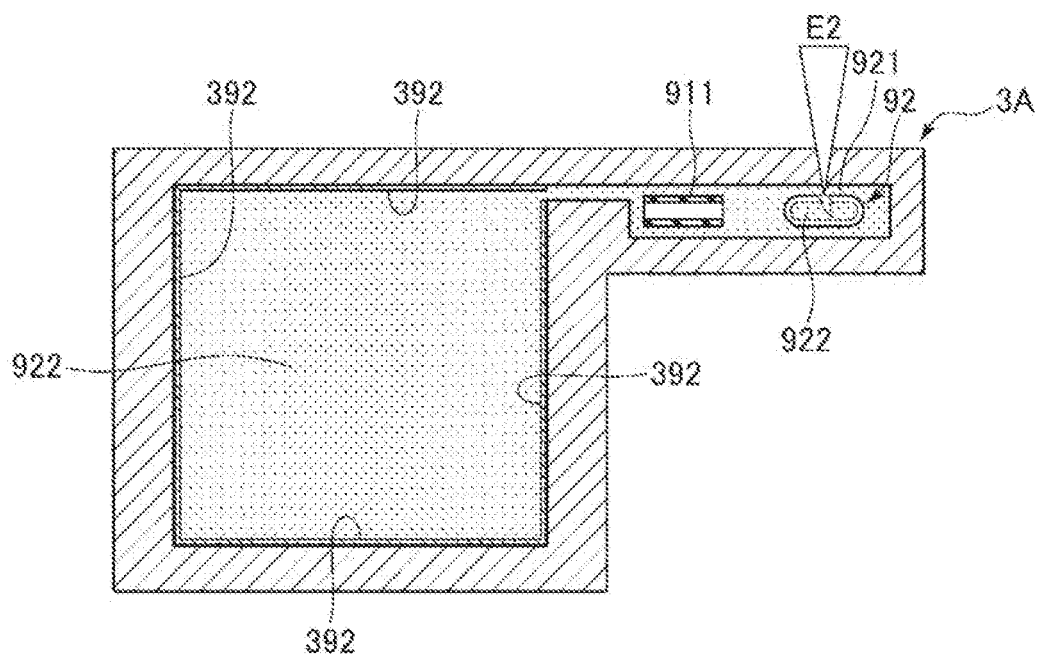
FIG. 14 is a cross-sectional view for illustrating the method of manufacturing the atomic cell shown in FIG. 7.

Next, as shown in FIG. 14, an energy beam E2 is emitted from the outside of the atomic cell container 3A toward the alkali metal accommodating body 92. Accordingly, an opening is formed in the alkali metal accommodating body 92, and the alkali metal atoms 922 accommodated in the alkali metal accommodating body 92 are vaporized. In this manner, the atomic cell 3 shown in FIG. 2 is obtained.

The energy beam E2 may be, for example, a laser beam.

2. Second Embodiment

Next, a magnetic sensor 100 which is a quantum interference device according to a second embodiment will be described.

Figure 15:
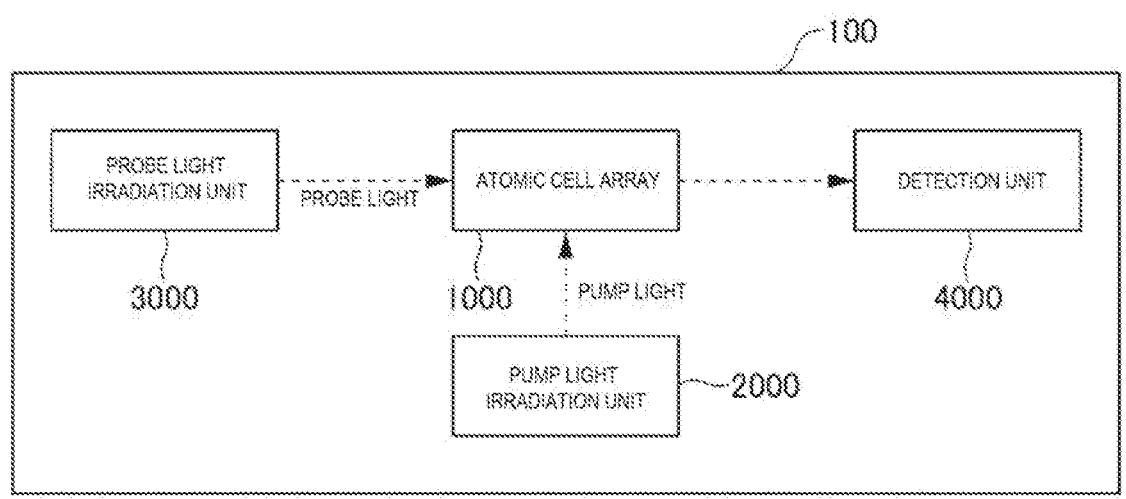
FIG. 15 is a functional block diagram showing a magnetic sensor which is a quantum interference device according to a second embodiment.
Figure 16:
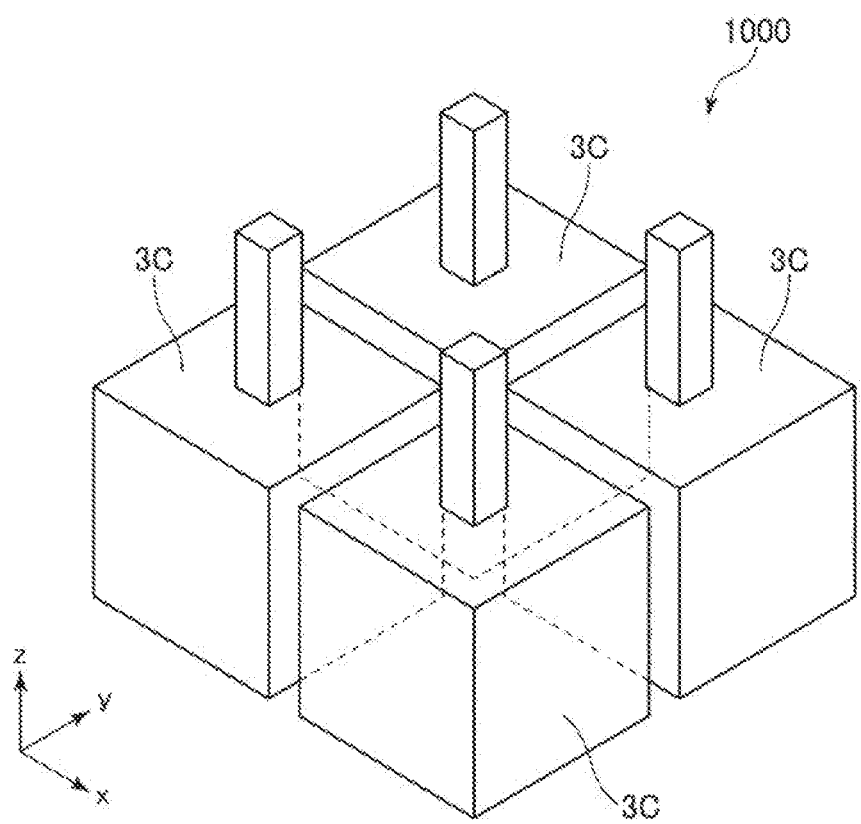
FIG. 16 is a perspective view of an atomic cell array of FIG. 15.

FIG. 15 is a functional block diagram showing the magnetic sensor 100 which is the quantum interference device according to the second embodiment. FIG. 16 is a perspective view of an atomic cell array of FIG. 15.

Hereinafter, the second embodiment will be described, and differences from the first embodiment will be mainly described in the following description, and the description of similar matters will be omitted. In FIGS. 15 and 16, the same components as those in the first embodiment are denoted by the same reference numerals.

The magnetic sensor 100 shown in FIG. 15 includes an atomic cell array 1000, a pump light irradiation unit 2000, a probe light irradiation unit 3000, and a detection unit 4000.

As shown in FIG. 16, the atomic cell array 1000 includes a plurality of atomic cells 3Cs. Alkali metal atoms are accommodated in these atomic cells 3Cs.

The pump light irradiation unit 2000 outputs pump light that interacts with the alkali metal atoms. When the pump light is emitted, outermost electrons of the alkali metal atoms are excited, and spin polarization occurs. The spin-polarized alkali metal atoms precess due to a magnetic field generated by an object to be measured. When the spin polarization of one alkali metal atom relaxes over time, since the pump light is continuous wave (CW) light, formation and relaxation of the spin polarization are repeated concurrently and continuously. As a result, steady spin polarization is formed for the entire group of the alkali metal atoms.

The probe light irradiation unit 3000 outputs probe light having a linearly polarized light component.

FIG. 16 shows an example of arrangement of the atomic cells 3C in the atomic cell array 1000. In the atomic cell array 1000 shown in FIG. 16, two atomic cells 3C are respectively disposed along an x axis and a y axis so as to form a two-dimensional matrix. In FIG. 16, three axes orthogonal to one another are defined as the x axis, the y axis, and a z axis.

Although not shown in FIGS. 15 and 16, in the atomic cells 3C, a coating film similar to the coating film 392 in the first embodiment is provided on the inner wall. The coating film includes the polydiyne compound PDY or the polydiene compound PDE. By providing such a coating film, it is possible to prevent relaxation of the spin polarization caused in the alkali metal atoms accommodated in an internal space of the atomic cell 3C. As described above, the coating film containing the polydiyne compound PDY or the polydiene compound PDE is formed by polymerizing, for example, polymerizable monomers and crosslinking the monomers. For this reason, monomer-derived unit structures are crosslinked by a covalent bond, so that a coating film stronger than that in the related art can be formed. As a result, the heat resistance of the coating film can be enhanced.

Therefore, even when the temperature of the atomic cell 3C increases in operation of the magnetic sensor 100, a manufacturing process, a transportation process, and the like, the spin polarization in the alkali metal atoms is less likely to be relaxed. As a result, the magnetic sensor 100 having good heat resistance and excellent reliability can be implemented.

In the second embodiment as described above, the similar effect as that of the first embodiment can be obtained.

Although the quantum interference device according to the present disclosure is described above based on the illustrated embodiments, the present disclosure is not limited thereto.

For example, in the quantum interference device according to the present disclosure, a configuration of each part in each of the above embodiments may be replaced with any configuration having similar function, and any configuration may be added to the configuration in each of the above embodiments.

In the above embodiments, the atomic oscillator and the magnetic sensor are described as examples of the quantum interference device, and the quantum interference device according to the present disclosure may be a device other than these devices, for example, an atomic gyroscope.

What is claimed is:

1. A quantum interference device, comprising:
   a light emitting element; and
   an atomic cell on which light from the light emitting element is incident,
   wherein the atomic cell accommodates alkali metal atoms therein,
   a coating film containing a polydiyne compound or a polydiene compound is disposed on an inner wall of the atomic cell,
   the polydiyne compound and the polydiene compound are polymers in each of which monomer-derived unit structures are crosslinked at a crosslinking part, and
   the crosslinking part is located at a center of the monomer-derived unit structure.

2. The quantum interference device according to claim 1, wherein the number of carbons in the monomer-derived unit structure is 20 or more and 60 or less.

3. The quantum interference device according to claim 1, wherein a terminal group of the monomer-derived unit structure is an alkyl group or a fluorine-containing group.

4. The quantum interference device according to claim 1, wherein the polydiyne compound and the polydiene compound are polymers obtained by topochemical polymerization of monomers.

5. A quantum interference device, comprising:
   a light emitting element; and
   an atomic cell on which light from the light emitting element is incident,
   wherein the atomic cell accommodates alkali metal atoms therein,
   a coating film containing a polydiyne compound or a polydiene compound is disposed on an inner wall of the atomic cell,
   the polydiyne compound and the polydiene compound are polymers in each of which monomer-derived unit structures are crosslinked at a crosslinking part, and
   the number of carbons in the monomer-derived unit structure is 20 or more and 60 or less.

6. The quantum interference device according to claim 5, wherein the crosslinking part is located at a center of the monomer-derived unit structure.

7. The quantum interference device according to claim 6, wherein a terminal group of the monomer-derived unit structure is an alkyl group or a fluorine-containing group.

8. The quantum interference device according to claim 6, wherein the polydiyne compound and the polydiene compound are polymers obtained by topochemical polymerization of monomers.

* * * * *